US009711466B2

(12) United States Patent
Kawasaki et al.

(10) Patent No.: US 9,711,466 B2
(45) Date of Patent: Jul. 18, 2017

(54) ELECTRONIC APPARATUS OPERABLE IN HIGH FREQUENCIES

(71) Applicant: Sumitomo Electric Industries, Ltd., Osaka-shi (JP)

(72) Inventors: Takeshi Kawasaki, Yokohama (JP); Mikoto Nakamura, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/182,734

(22) Filed: Jun. 15, 2016

(65) Prior Publication Data
US 2017/0005047 A1 Jan. 5, 2017

(30) Foreign Application Priority Data

Jun. 30, 2015 (JP) .................................. 2015-132106
Dec. 25, 2015 (JP) .................................. 2015-254854

(51) Int. Cl.
*H01L 23/66* (2006.01)
*H01L 23/52* (2006.01)
*H01L 23/522* (2006.01)
*H01L 23/00* (2006.01)

(52) U.S. Cl.
CPC .......... *H01L 23/66* (2013.01); *H01L 23/5222* (2013.01); *H01L 23/5226* (2013.01); *H01L 24/02* (2013.01); *H01L 24/10* (2013.01); *H01L 2924/1205* (2013.01)

(58) Field of Classification Search
CPC . H01L 23/66; H01L 23/5222; H01L 23/5226; H01L 24/02; H01L 24/10
See application file for complete search history.

(56) References Cited

U.S. PATENT DOCUMENTS

| 8,120,040 | B2* | 2/2012 | Asai | G02B 6/43 257/169 |
| 9,461,355 | B2* | 10/2016 | Nair | H01Q 1/2291 |
| 2011/0037163 | A1* | 2/2011 | Lachner | H01L 21/561 257/693 |
| 2012/0104625 | A1* | 5/2012 | Park | H01L 24/19 257/774 |
| 2012/0222891 | A1* | 9/2012 | Ishida | H05K 1/0236 174/255 |
| 2012/0286400 | A1* | 11/2012 | Camacho | H01L 21/6835 257/621 |
| 2014/0117515 | A1* | 5/2014 | Lachner | H01Q 1/2283 257/664 |
| 2015/0340765 | A1* | 11/2015 | Dang | H01Q 21/0075 343/893 |

FOREIGN PATENT DOCUMENTS

JP 2004-327611 A 11/2004

* cited by examiner

*Primary Examiner* — Ida M Soward
(74) *Attorney, Agent, or Firm* — Venable LLP; Michael A. Sartori; F. Brock Riggs

(57) ABSTRACT

An electronic apparatus that includes a semiconductor device mounted on an assembly base is disclosed. The semiconductor device includes a transmission line, whose impedance is matched to characteristic impedance, and a pad connected to the transmission line, through which a high frequency signal is supplied to or extracted from the semiconductor device. The pad accompanies a stub line that is concurrently formed with the transmission line and grounded within the semiconductor device. The stub line operates as a short stub that may compensate parasitic capacitance attributed to the pad.

10 Claims, 23 Drawing Sheets

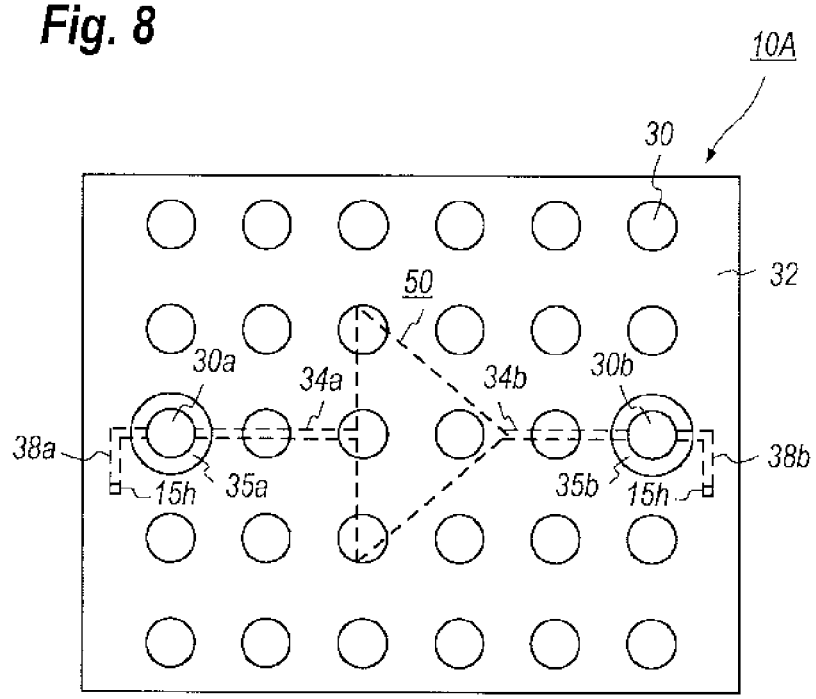

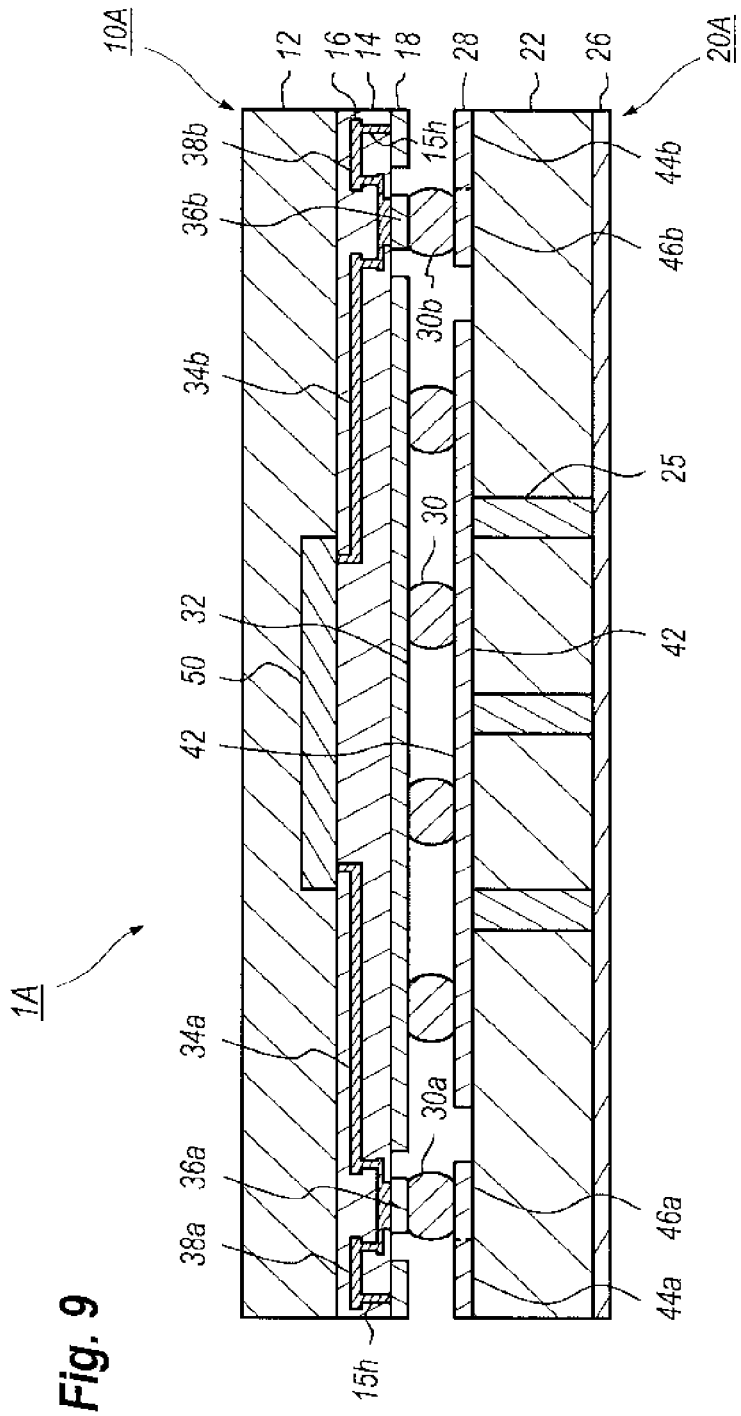

ELECTRONIC APPARATUS OPERABLE IN HIGH FREQUENCIES

CROSS-REFERENCE TO RELATED APPLICATION

This application is based upon and claims the benefit of priority of the prior Japanese Patent Application No. 2015-132106, filed on Jun. 30, 2015, and the prior Japanese Patent Application No. 2015-254854, filed on Dec. 25, 2015, the entire contents of which are incorporated herein by reference.

BACKGROUND (i) Technical Field

A certain aspect of the embodiments discussed herein relates to an electronic apparatus operable in high frequencies.

(ii) Related Art

Transmission lines, such as micro-strip lines and/or co-planar lines, have been implemented within an electronic apparatus operable in high frequencies to carry signals having frequency components higher than several gigahertz. Those transmission lines needs to be coupled to an external circuit through respective pads providing in first ends of the transmission lines, and the pads are electrically coupled to the external circuit by bonding wires, bumps, and so on. Such an electronic apparatus is often equipped with, on a circuit board, semiconductor devices capable of outputting large power, which is often called as a power amplifying module. Japanese patent application laid open No. 2004-327611 discloses such a power amplifying module.

SUMMARY

The transmission lines may be characterized in characteristic impedance thereof matching to characteristic impedance of a system. However, the pads provided in the ends of the transmission lines are not always matched in impedance thereof to the characteristic impedance of the system, because the pads need to have a primary function of secure and reliable connection to the external devices. Accordingly, signal reflection at the pads due to the impedance mismatching often occurs and degrades the quality of the signal to be transmitted on the transmission lines. In particular, when the signal contains extremely high frequency components in, for instance, micro-wave band and/or millimeter-wave band, the signal reflection at the impedance mismatched boundaries sometimes becomes fatal.

One aspect of the present application relates to a semiconductor device that is operable in frequencies higher than 50 GHz. The semiconductor device includes a semiconductor substrate, a ground pattern, a signal line, a pad, and a stub line. The semiconductor substrate includes a semiconductor active element therein. The ground pattern is provided on the semiconductor substrate and sandwiches an insulating layer between the semiconductor substrate and the ground pattern. The signal line, which is provided in the semiconductor substrate and overlaps with the ground pattern and is interposed in the insulating layer so as to constitute a transmission line that is a micro-strip line, connects the semiconductor active element to the pad. The pad is provided on the semiconductor substrate and connected to the transmission line. The stub line, which overlaps with the ground pattern and is interposed in the insulating layer, is connected to the pad in one end thereof and to the ground in another end thereof. A feature of the semiconductor device of the present invention is that the stub line has a length shorter than a quarter-wavelength ($\lambda/4$) of a signal carried on the transmission line. That is, the stub line of the present invention behaves as a short stub that compensates parasitic capacitance attributed to the pad.

Another aspect of the present application relates to an electronic apparatus that is operable in frequencies higher than, for instance, 40 GHz. The electronic apparatus of the invention includes a semiconductor device and an assembly base on which the semiconductor device is mounted by a ball-grid-array (BGA) arrangement. The semiconductor device includes a semiconductor active element, a transmission line that is a micro-strip line, and a pad connected to the transmission line. The assembly base includes a pad having a bump thereon and a transmission line extracted from the pad of the assembly base. The bump connects the pad of the semiconductor device to the pad of the assembly base. The semiconductor active element receives or outputs a signal through the transmission line of the assembly base, the pad of the assembly base, the bump, the pad of the semiconductor device, and the transmission line of the semiconductor device. A feature of the electronic apparatus of the present invention is that the pad of the semiconductor device accompanies a stub line of the type of the micro-strip line that operates as a short stub and has a length shorter than a quarter-wavelength ($\lambda/4$) of the signal input to or extracted from the semiconductor active element.

BRIEF DESCRIPTION OF THE DRAWINGS

The foregoing and other purposes, aspects and advantages will be better understood from the following detailed description of a preferred embodiment of the invention with reference to the drawings, in which:

FIG. 8 is a plan view of a semiconductor device according to a second embodiment;

FIG. 9 schematically shows a cross section of an electronic apparatus equipped with the semiconductor device shown in FIG. 8;

DETAILED DESCRIPTION

Comparative Example

Figure 1:
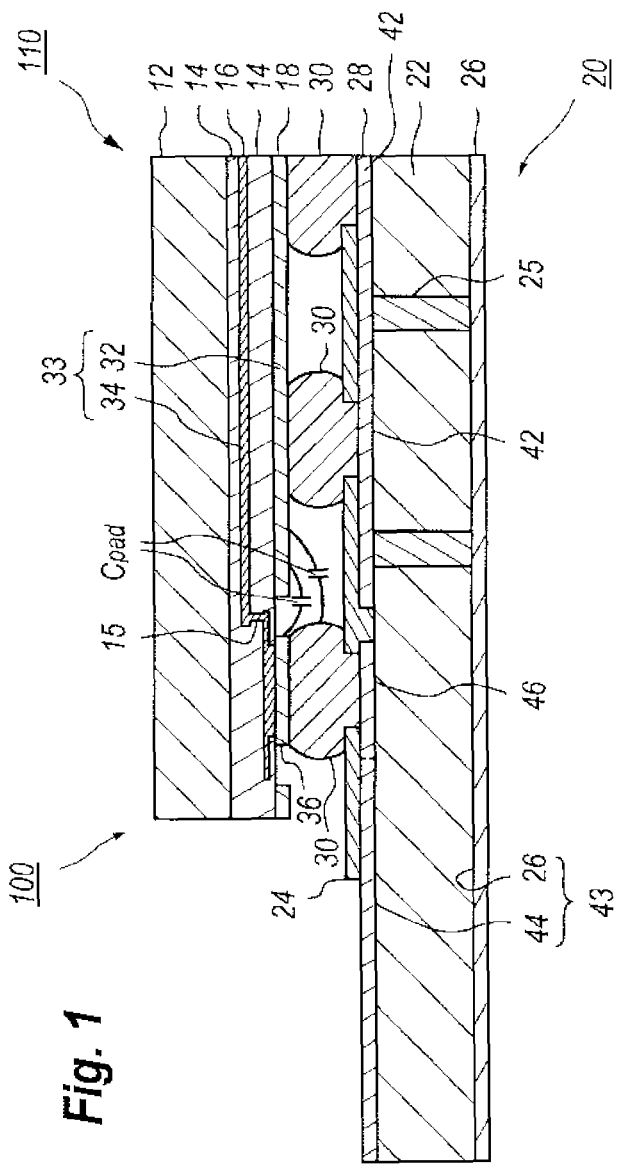
FIG. 1 schematically illustrates a cross section of an electronic apparatus according to a comparative example.

First, a comparative example will be described. FIG. 1 schematically illustrates a cross section of an electronic apparatus 100 according to the comparative example. The electronic apparatus 100 includes a semiconductor device 110 mounted on an assembly base 20 upside down through bumps 30. The semiconductor device 110 includes, on a semiconductor substrate 12 thereof, an insulating layer 14, an interconnection 16 formed in the insulating layer 14, and a metal pattern 18 on a top of the insulating layer 14. A via hole 15, which is filled with metal, electrically connects the metal pattern 18 on the surface of the insulating layer 14 to the interconnection 16 in the insulating layer 14. The interconnection 16 includes a signal line 34 that is electrically connected to a semiconductor element integrated within the semiconductor substrate 12. The metal pattern 18 includes a ground pattern 32 and a pad 36, where the signal line 34 overlaps with the ground pattern 32, which constitutes a transmission line 33 that is a micro-strip line.

The assembly base 20 also includes a metal pattern 28 that includes a ground pattern 42, a pad 46, and a signal line 44 on a top surface of a substrate 22; while, the substrate 22 also includes a ground pattern 26 on a whole back surface thereof. The ground pattern 42 on the top surface of the substrate 22 is electrically connected to the ground pattern 26 on the back surface of the substrate through via holes 25, which are also filled with metal. A portion of the metal pattern 28 is covered by a cover lay 24. The signal line 44 on the top surface overlaps with the ground pattern 26 on the back surface, which constitutes a transmission line 43 of a type of a micro-strip line.

Figure 2A:
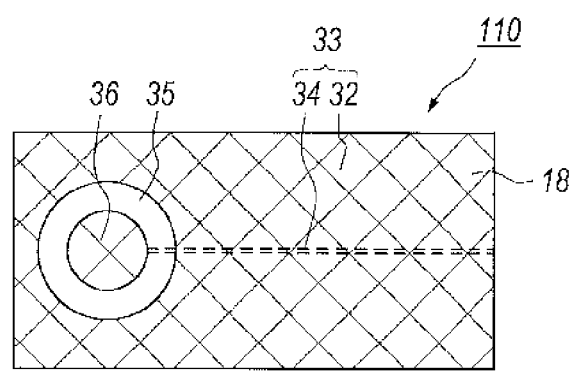
FIG. 2A is a plan view of a semiconductor device of the comparative example, which is viewed from an assembly base.
Figure 2B:
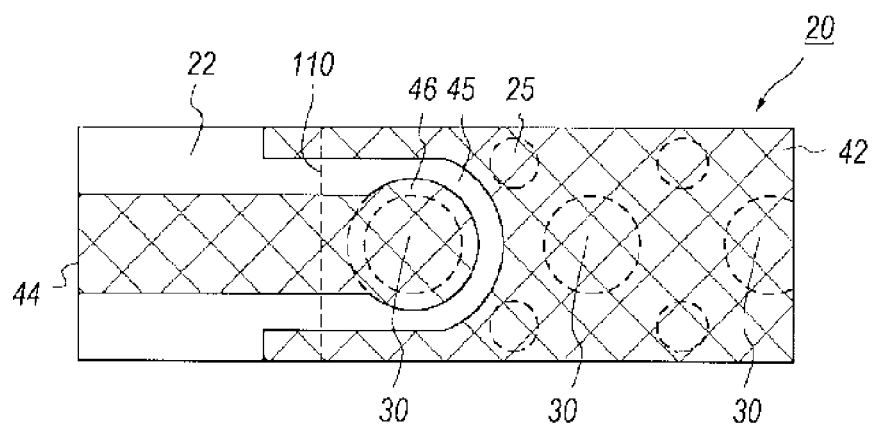
FIG. 2B is a plan view of an assembly base of the comparative example, which is viewed from the semiconductor device.

FIG. 2A is a plan view of the semiconductor device 110, which is viewed from the assembly base 20, while, FIG. 2B is a plan view of the assembly base 20 viewed from the semiconductor device 110, where FIG. 2A illustrates the signal line 34 buried in the insulating layer 14 by broken lines. As shown in FIG. 2A, the semiconductor device 110 includes the ground pattern 32 on the top surface thereof, where the ground pattern 32 has a circular vacant spot 35 within which the pad 36 is formed so as to leave a donut-shaped vacant area. That is, the pad 36 maybe electrically isolated from the ground pattern 32 by a vacant donut-shaped pattern. The signal line 34 buried in the insulating layer 14 overlaps with the ground pattern 32, which constitutes the transmission line that is a micro-strip line.

FIG. 2B is also a plan view of the assembly base 20, which is viewed from the semiconductor device 110, where FIG. 2B illustrates the via holes 25, the bumps 30, and an edge of the semiconductor device 110 by respective broken lines, or circles. The ground pattern 42 on the top surface of the substrate 22 faces the ground pattern 32 of the semiconductor device 110. The ground pattern 42 includes a vacant stripe 45 that surrounds the pad 46. Thus, the pad 46 is electrically connected to the signal line 44 and electrically isolated from the ground pattern 42 by the vacant stripe 45. The bumps 30 are provided on the pad 46 and the ground pattern 42. Also, the via holes 25 electrically connect the ground pattern 42 on the top surface of the substrate 22 to the ground pattern 26 on the back surface thereof.

The signal line 34 in the semiconductor device 110 has a width determined such that the characteristic impedance thereof is, for instance, 50Ω. When a signal transmitted on the signal line 34 contains high frequency components, the signal line 34 decreases in width. For instance, when the signal contains frequency components in a millimeter-wave band, the width of the signal line 34 becomes around 10 μm or less. On the other hand, the pad 36 needs to have dimensions of around 100 μm to mount the semiconductor device 110 on the assembly base 20 by, for instance, the bumps 30. Thus, the pad 36 and/or the bump 30 inevitably causes parasitic capacitive elements between the pad 36 and the ground pattern 32, and between the bump 30 and the ground pattern 32, which disarranges the impedance matching condition of the transmission line 33 at the pad 36.

First Embodiment

Figure 3:
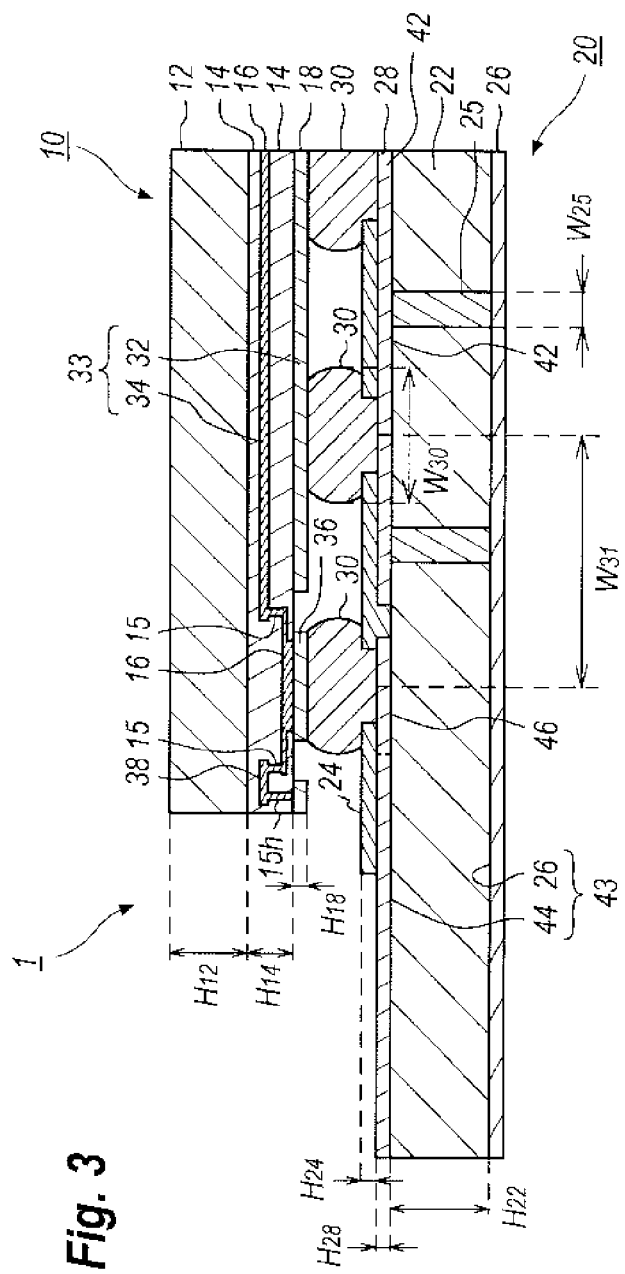
FIG. 3 schematically illustrates a cross section of an electronic apparatus according to a first embodiment.
Figure 4A:
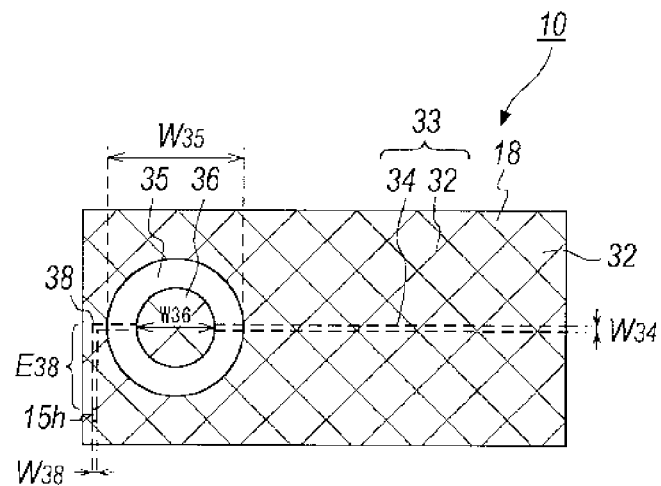
FIG. 4A is a plan view of a semiconductor device of the first embodiment.
Figure 4B:
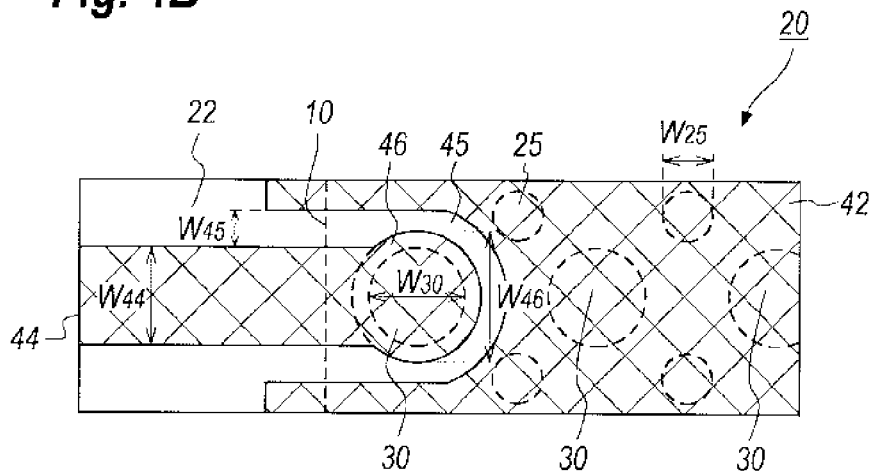
FIG. 4B is also a plan view of an assembly base of the first embodiment.

FIG. 3 schematically illustrates a cross section of an electronic apparatus 1 according to a first embodiment. FIG. 4A is a plan view of the semiconductor device 10, while, FIG. 4B is also a plan view of the assembly base 20. A feature of the electronic apparatus 1 of the first embodiment is that the interconnection 16 includes a stub line 38 whose one end is connected to the pad 36 through the via hole 15, while, whose another end is grounded to the ground pattern 32 through a via hole 15h. Symbols $H_{12}$ to $H_{28}$ correspond to thicknesses of the semiconductor substrate 12, the insulating layer 14, the metal pattern 18, the substrate 22, the cover lay 24, and the metal pattern 28, respectively. Other symbols of $W_{25}$ to $W_{46}$ correspond to widths of the via hole 25, the bump 30, the signal line 34, the vacant spot 35, the pad 36, the stub line 38, the signal line 44, the vacant stripe 45, and the pad 46, respectively. Symbols $W_{31}$ and $E_{38}$ correspond to a pitch between the bumps 30 and a length of the stub line 38, respectively. Other arrangements of the semiconductor device 10 and those of the assembly base 20 are the same with those of the comparative example shown in FIGS. 1 to 2B.

Figure 5:
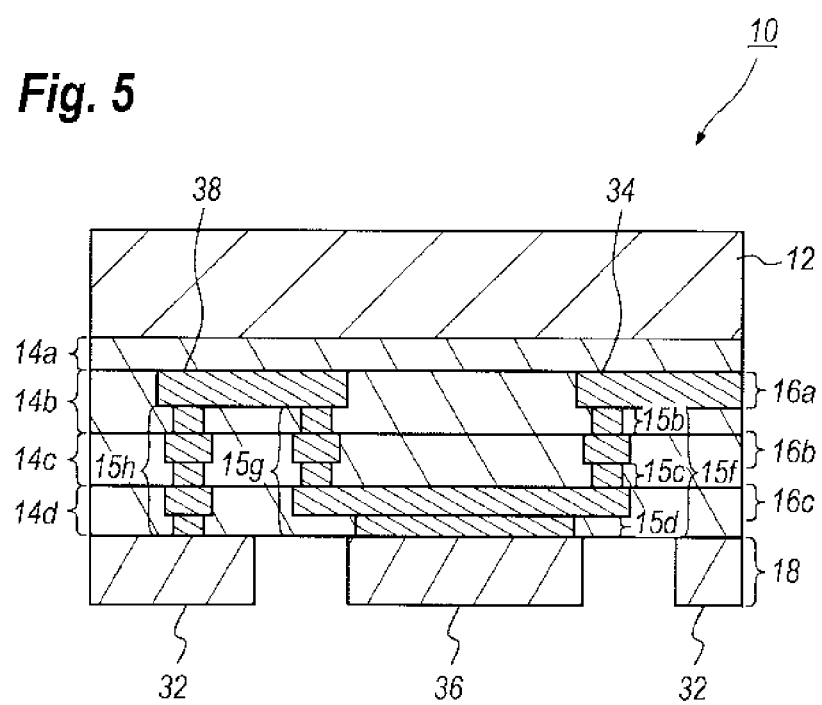
FIG. 5 shows a magnified cross section of a portion around a pad and a stub line of the semiconductor device shown in FIG. 3.

FIG. 5 shows a magnified cross section of a portion around the pad 36 and the stub line 38. The insulating layer 14 is formed by staking a plurality of layers 14a to 14d, where the latter three layers 14b to 14d respectively include interconnections 16a to 16c therein. On the topmost layer 14d, where FIG. 5 illustrates the semiconductor device 10 upside down, located is the metal pattern 18. Via holes 15b to 15d respectively pass through the three layers 14b to 14d. The interconnection 16a in the layer 14b includes the signal line 34 and the stub line 38, where one of the ends of the signal line 34 is electrically connected to the pad 36 through a via hole 15f that includes the via holes 15b to 15d, and the interconnections 16b and 16c. One end of the stub line 38 is also connected to the pad 36 through a via hole 15g that includes the via holes 15b to 15d and the interconnections 16b and 16c; while, end of the stub line 38 is grounded to the ground pattern 32 through the via hole 15h also including the via holes 15b and 15d and the interconnections 16c and 16d.

The stub line 38 of the present embodiment overlaps with the ground pattern 32, and is connected to the pad 36 in one end thereof through the via hole 15g and to the ground pattern 32 in the other end thereof through the via hole 15h. Thus, a line passing from the pad 36 to the ground pattern 32 through the via hole 15g, the stub line 38, and the via hole 15h may operate as a short stub. Because two via holes 15g and 15h have lengths far shorter than the length of the stub line 38, the length of the stub line 38 substantially becomes the length of the short stub. The length of the stub line 38 is shorter than a quarter of a wavelength $\lambda/4$, where $\lambda$ is a wavelength of a signal propagating through the transmission line 33, which means that the stub line 38 may be regarded as an inductor for a signal propagating through the transmission line 33. Denoting parasitic capacitance of the pad 36 against the ground pattern 32 and inductance of the stub line 38 to be $C_{pad}$ and $L_{stub}$, respectively; a capacitance $C_{total}$ determined by the capacitance $C_{pad}$ of the pad 36 and the inductance $L_{stub}$ of the stub line 38 is given by:

$$C_{total} = C_{pad} - 1/(\omega^2 \cdot L_{stub}).$$

Thus, the capacitance $C_{total}$ may be adjusted by varying the length of the stub line 38, which means that the length of the stub line 38 may compensate the impedance mismatching between the pad 36 and the transmission line 33.

Alternatively, a short stub may be formed by the metal pattern 18 or 28 respectively provided on the surfaces of the semiconductor device 10 and the assembly base 20. However, the electrical length of a short stub is not optional because a distance between the pad 36 and the ground pattern 32 and/or a distance between the pad 46 and the ground pattern 42 may not be widely varied. On the other hand, the first embodiment provides a short stub by the stub line 38 overlapping with the ground pattern 32, which enables to vary the length of the stub line widely. Also, the stub line 38 is formed concurrently with the formation of the transmission line 33 (see FIG. 3) on the semiconductor substrate 12, which means that the stub line 38 may be precisely formed by the semiconductor process, and the total capacitance $C_{total}$ described above may be precisely controlled. The stub line 38 is preferably to be formed on an opposite side of the pad 36 from the signal line 34. Moreover, the stub line 38 is preferably extended in a direction making an angle of at least 90° against the signal line 34.

When a signal undergoing the electronic apparatus 1 contains frequency components of 40 to 60 GHz, typical dimensions and materials of respective elements are listed below. However, those dimensions and materials are merely examples and may be optionally replaced to various dimensions and materials. In Table 1 below, parameters $\epsilon$ and $Z_0$ are the dielectric constant of a material and the characteristic impedance of the transmission line, respectively.

TABLE 1

| | |
|---|---|
| Semiconductor substrate 12 | GaAs, $H_{12}$ = 250 µm |
| Insulating layer 14 | polymide, $\epsilon$ = 3.5, $H_{14}$ = 8 µm |
| Metal pattern 18 | gold (Au), $H_{18}$ = 2 µm |
| Bump 30 | solder, $H_{30}$ = 100 µm, $W_{30}$ = 150 µm, $W_{31}$ = 400 µm |
| Signal line 34 | $Z_0$ = 50 Ω, $W_{34}$ = 10 µm |
| Vacant spot 35 | $W_{35}$ = 250 µm |
| Pad 36 | $W_{36}$ = 150 µm |
| Stub line 38 | $Z_0$ = 50 Ω, $W_{38}$ = 10 µm, $E_{38}$ = 250 µm |
| Substrate 22 | Teflon ™, $H_{22}$ = 101 µm |
| Cover lay 24 | $H_{24}$ = 30 µm |
| Via hole 25 | copper (Cu), $W_{25}$ = 100 µm |
| Metal pattern 28 | copper (Cu), $H_{24}$ = 30 µm |
| Signal line 44 | $Z_0$ = 50 Ω, $W_{44}$ = 190 µm |
| Vacant stripe 45 | $W_{45}$ = 100 µm |
| Pad 46 | $W_{46}$ = 250 µm |

Figure 6A:
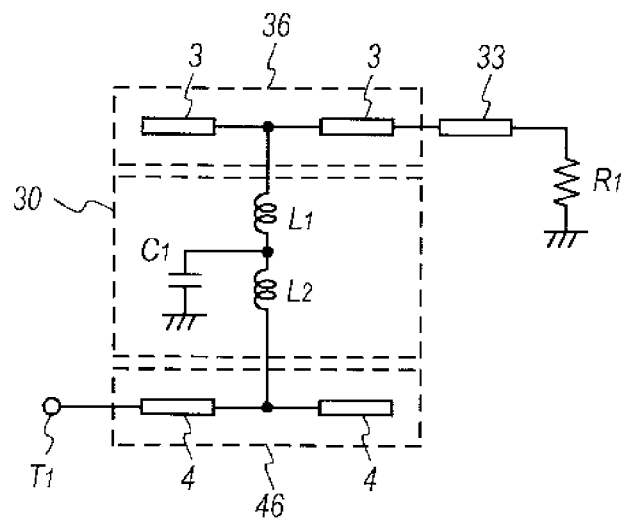
FIG. 6A is an equivalent circuit diagram of the electronic apparatus of the comparative example.
Figure 6B:
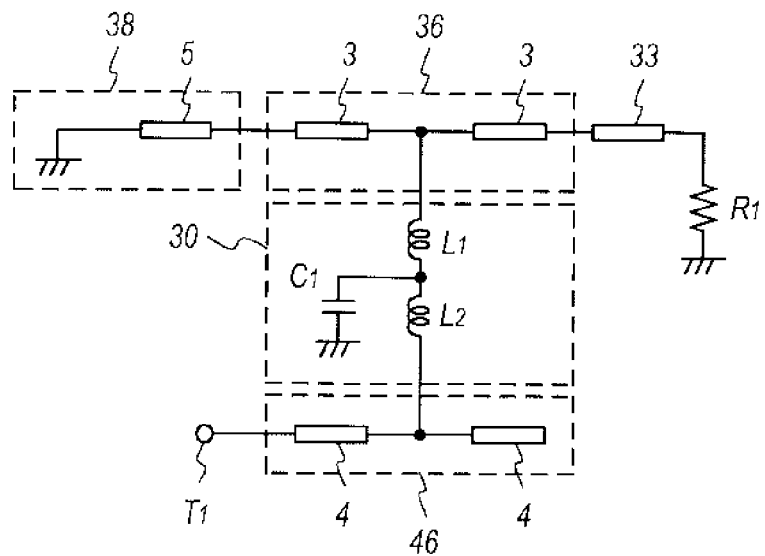
FIG. 6B shows an equivalent circuit diagram of the electronic apparatus of the first embodiment.

Next, signal reflection by one of s-parameters $S_{11}$ at the pad viewed from the signal line 44 is numerically evaluated for the first embodiment and the comparative example. The numerical calculation was carried out for the dimensions and the materials listed in Table 1. FIG. 6A is an equivalent circuit diagram of the electronic apparatus 1 of the comparative example, while, FIG. 6B shows an equivalent circuit diagram of that of the present embodiment. As shown in FIGS. 6A and 6B, the bump 30 is denoted by inductors $L_1$ and $L_2$, and a capacitor $C_1$, where two inductors $L_1$ and $L_2$ are connected in series between the pads 36 and 36; while, the capacitor $C_1$ is connected between two inductors $L_1$ and $L_2$ and the ground. The numerical calculation assumed that two inductors $L_1$ and $L_2$ had inductances of 5 pF, and the capacitor $C_1$ has a capacitance of 15 pF.

Also, the numerical calculation regarded the pads 36 and 46 as two transmission lines 3 and 4 with lengths and widths respectively corresponding to the physical dimensions of the pads 36 and 46. The transmission line 33 was assumed to be terminated by a resistor $R_1$ having a resistance of 50Ω. The stub line 38 was equivalently denoted by a transmission line 5. The numerical calculation further assumed that a terminal $T_1$ corresponded to the transmission line 43 provided on the assembly base 20, and calculated the s-parameter $S_{11}$ of the bump 30 viewed from the terminal $T_1$.

Figure 7A:
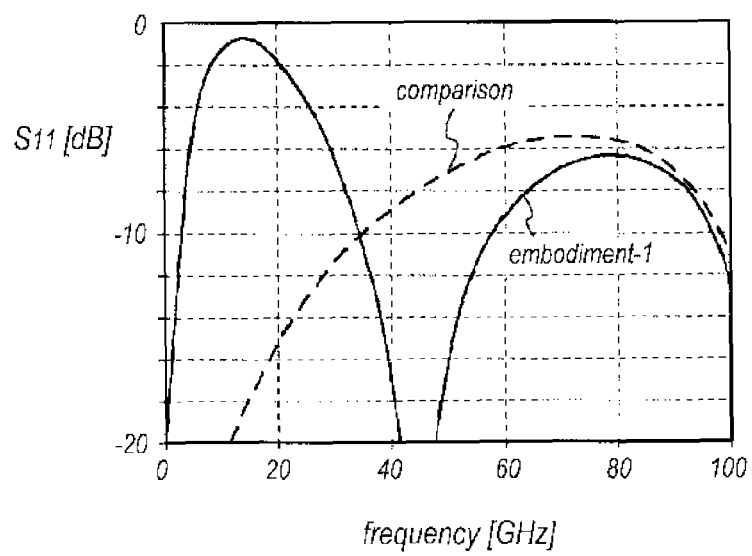
FIGS. 7A and 7B show results of the numerical calculation of an s-parameter $S_{11}$, where solid lines in FIGS. 7A and 7B correspond to the first embodiment and broken lines correspond to the comparative example.
Figure 7B:
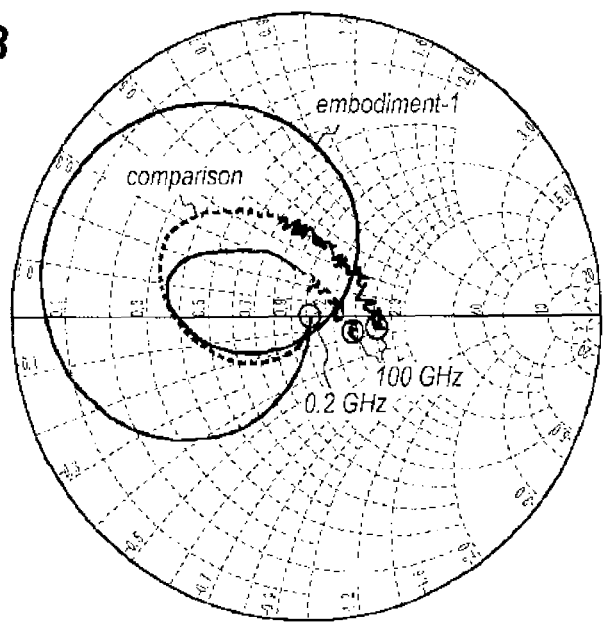

FIGS. 7A and 7B show results of the numerical calculation of the s-parameter $S_{11}$, where solid lines in FIGS. 7A and 7B correspond to the present embodiment and broken lines correspond to the comparative example. As shown in FIG. 7A, the comparative example increases the s-parameter $S_{11}$ in frequencies higher than 40 GHz. On the other hand, the s-parameter $S_{11}$ of the present embodiment becomes smaller than that of the comparative example in a frequency range from 40 to 60 GHz.

FIG. 7B shows the s-parameter $S_{11}$ shown in FIG. 7A by the smith chart in frequencies from 0.2 GHz to 100 GHz. As shown in FIG. 7B, the first embodiment achieves the smaller signal reflection $S_{11}$ in higher frequencies. The stub line 38 preferably has a length longer than λ/12 and shorter than 3λ/12. The stub line 38 further preferably has a length of λ/6.

Second Embodiment

A second embodiment relates to a monolithic microwave integrated circuit, hereafter denoted merely as an MMIC, that is equipped with the semiconductor device 10 of the first embodiment. FIG. 8 is a plan view of a semiconductor device 10A of the second embodiment, where FIG. 8 illustrates signal lines 34a and 34b, stub lines 38a and 38b, and a semiconductor active element 50 as respective broken lines. FIG. 9 schematically shows a cross section of an electronic apparatus 1A that is equipped with the semiconductor device 10A shown in FIG. 8.

Referring to FIG. 8, the semiconductor substrate 12 integrates the semiconductor active element 50 therein, and the signal lines 34a and 34b are connected to and extracted from the semiconductor active element 50. The semiconductor active element 50 may be a type of, for instance, a high electron-mobility transistor (HEMT) having a channel layer made of InGaAs and a carrier-supplying layer made of AlGaAs. Alternatively, the semiconductor active element 50 may be a type of a field effect transistor (FET), or an electronic circuits equipped with the HEMT and/or the FET. The semiconductor substrate 12, in addition to an ordinary substrate where some semiconductor active elements are integrated thereon, maybe an insulating substrate. For instance, the semiconductor substrate 12 may be made of sapphire with semiconductor layers epitaxially grown thereon.

The insulating layer 14 forms the ground pattern 32 that accompanies vacant spots 35a and 35b, and pads 36a and 36b in respective centers of the vacant spots 35a and 35b. One of the ends of the stub line 38a is extracted from the pad 36a, while, the other end of the stub line 38a is grounded to the ground pattern 32 through the via hole 15h. The other pad 36b is connected to the other signal line 34b and the other stub line 38b. One end of the stub line 38b is also grounded to the ground pattern 32 through the via hole 15h. The stub lines 38a and 38b are short stubs with electrical lengths shorter than one quarter wavelength λ/4 of the signal undergoing the semiconductor device 10A. The pad 36a is an input terminal through which an input signal enters, while, the other pad 36b is an output terminal through which an amplified high-frequency signal is output.

The pad 36a is connected to a pad 46a provided on the assembly base 20 through a bump 30a. Also, the other pad 36b is connected to a pad 46b through the other bump 30b. Other bumps 30a provided on the semiconductor device 10A constitute, what is called, a ball grid array (BGA). Other arrangements of the semiconductor device 10A and the assembly base 20 are the same with those explained in the first embodiment.

When the bumps 30a and 30b are respectively provided on the pads 36a and 36b, the parasitic capacitance around the bumps 30a and 30b inevitably increases, which enlarges the signal reflection at the pads 36a and 36b. The stub lines 38a and 38b according to the present embodiment effectively suppress the signal reflection at the pads 36a and 36b.

Third Embodiment

Figure 10:
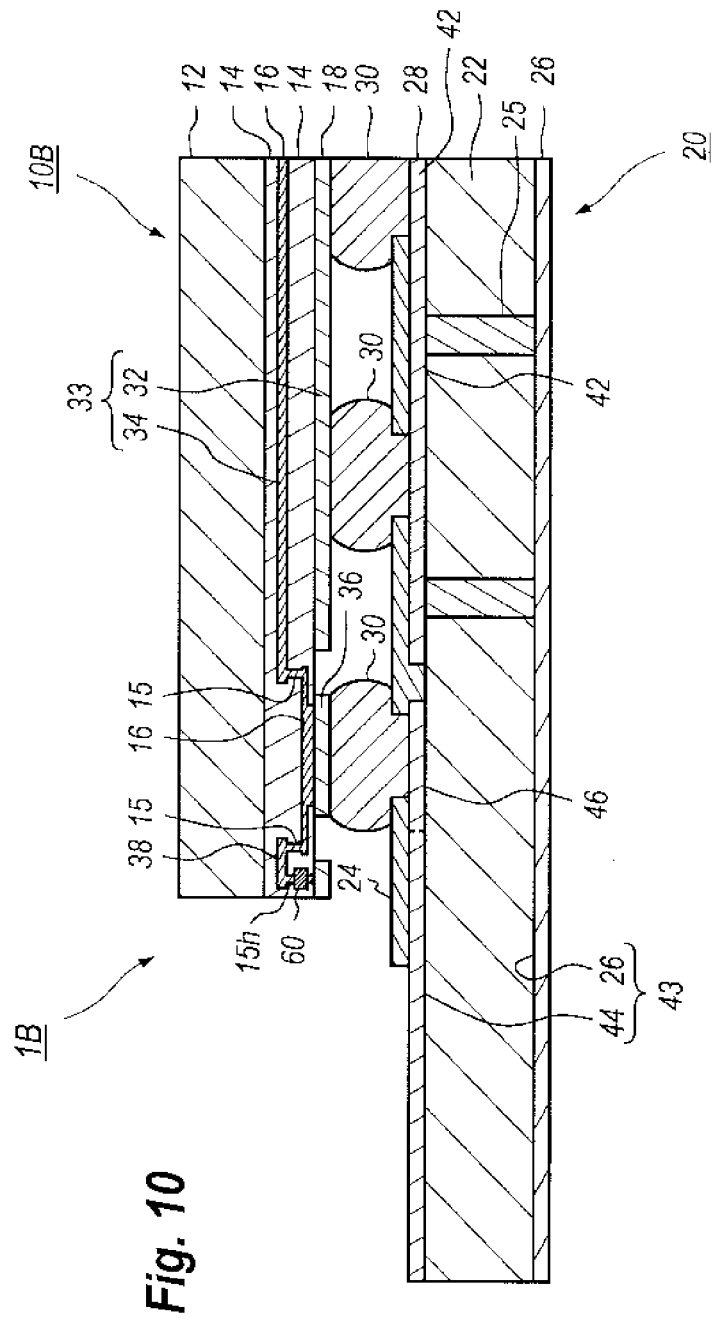
FIG. 10 schematically illustrates a cross section of an electronic apparatus including a semiconductor device according to a third embodiment.
Figure 11A:
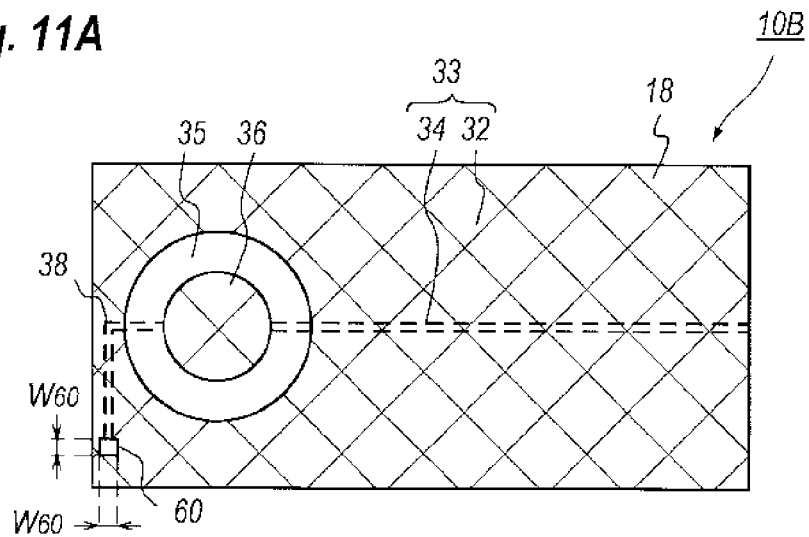
FIG. 11A is a plan view of the semiconductor device of the third embodiment, which is viewed from an assembly base, and FIG. 11B magnifies a portion around a pad of the semiconductor device of the third embodiment.
Figure 11B:
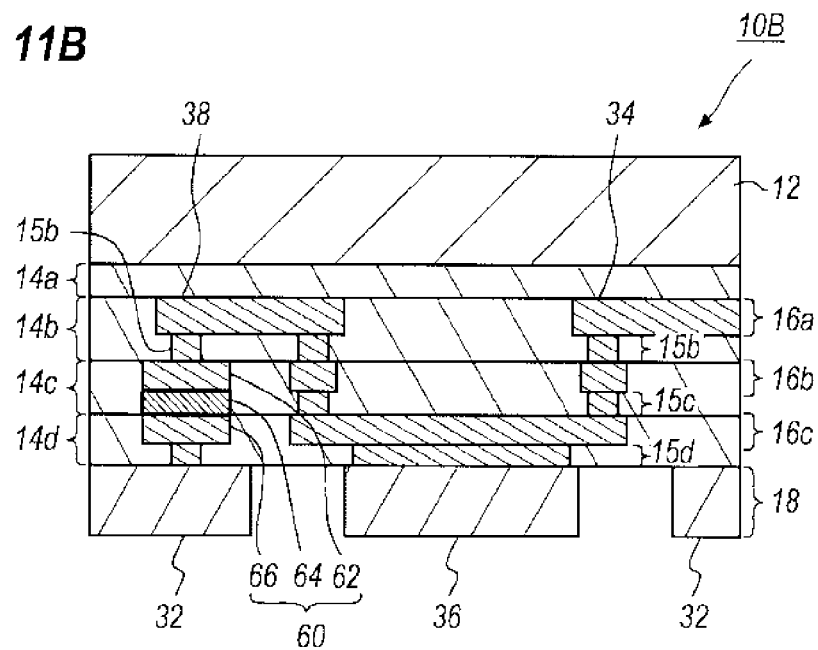

A third embodiment relates to an arrangement where one end of the stub line 38 is grounded through a capacitor. FIG. 10 schematically illustrates a cross section of an electronic apparatus 1B including a semiconductor device 10B according to the third embodiment. FIG. 11A is a plan view of the semiconductor device 10B, which is viewed from the assembly base 20, and FIG. 11B magnifies a portion around the pad 36 of the semiconductor device 10B. In the third embodiment, the assembly base 20 has an arrangement same with that of the first embodiment shown in FIG. 4B. The electronic apparatus 1B of the present embodiment includes a capacitive element 60 between the end of the stub line 38 and the ground pattern 32. The capacitive element 60 includes electrodes 62 and 66, and a dielectric material 64 between the electrodes 62 and 66. One end of the stub line 38 is electrically connected to one of the electrodes 62 through the via hole 15b; while, the ground pattern 32 is connected to the other of the electrodes 66 through the via hole 15d.

The capacitive element 60 may electrically isolate the stub line 38 from the ground pattern 32 in a direct current (DC) mode; that is, the stub line 38 may be regarded to have an open end in the DC mode, but regarded to be grounded in the AC mode, or in high frequencies. In other words, the capacitive element 60 is designed so as to have a capacitance making the stub line 38 be in short circuit in high frequencies. Thus, the stub line 38 may be regarded as a short stub in high frequencies even the stub line 38 is opened in the DC mode.

Exemplary typical conditions for the capacitive element 60 in frequencies from 40 GHz to 60 GHz are summarized in Table 2 below.

TABLE 2

| | |
|---|---|
| Electrode 62 | gold (Au), $H_{62}$ = 0.1 μm |
| Dielectric film 64 | silicon nitride (SiN, ∈ = 7.9), $H_{64}$ = 0.2 μm |
| Electrode 66 | gold (Au), $H_{66}$ = 0.1 μm |
| Capacitive element 60 | $W_{60}$ = 50 μm |

Fourth Embodiment

Figure 12:
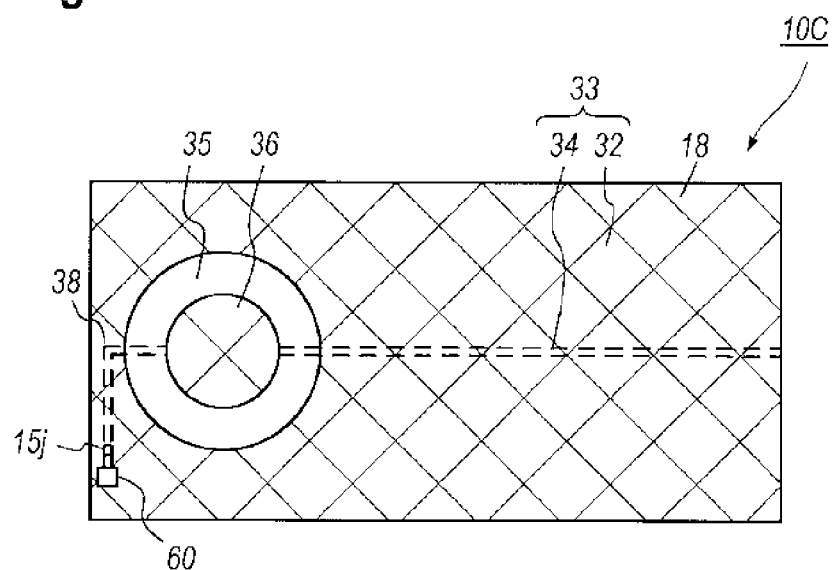
FIG. 12 is a plan view of a semiconductor device according to a fourth embodiment.

A fourth embodiment of the stub line 38 includes, in addition to the capacitive element 60 of the previous embodiment, a via hole 15j that connects the end of the stub line 38 to the ground pattern 32, as shown in FIG. 12. That is, the capacitive element 60 and the via hole 15j are arranged in parallel between the end of the stub line 38 and the ground pattern 32. The capacitive element 60 grounds the stub line 38 in high frequencies; while, the via hole 15j grounds the stub line 38 in the DC mode. Thus, the stub line 38 may matches the impedance of the pad 36 in a wider frequency range.

Fifth Embodiment

Figure 13:
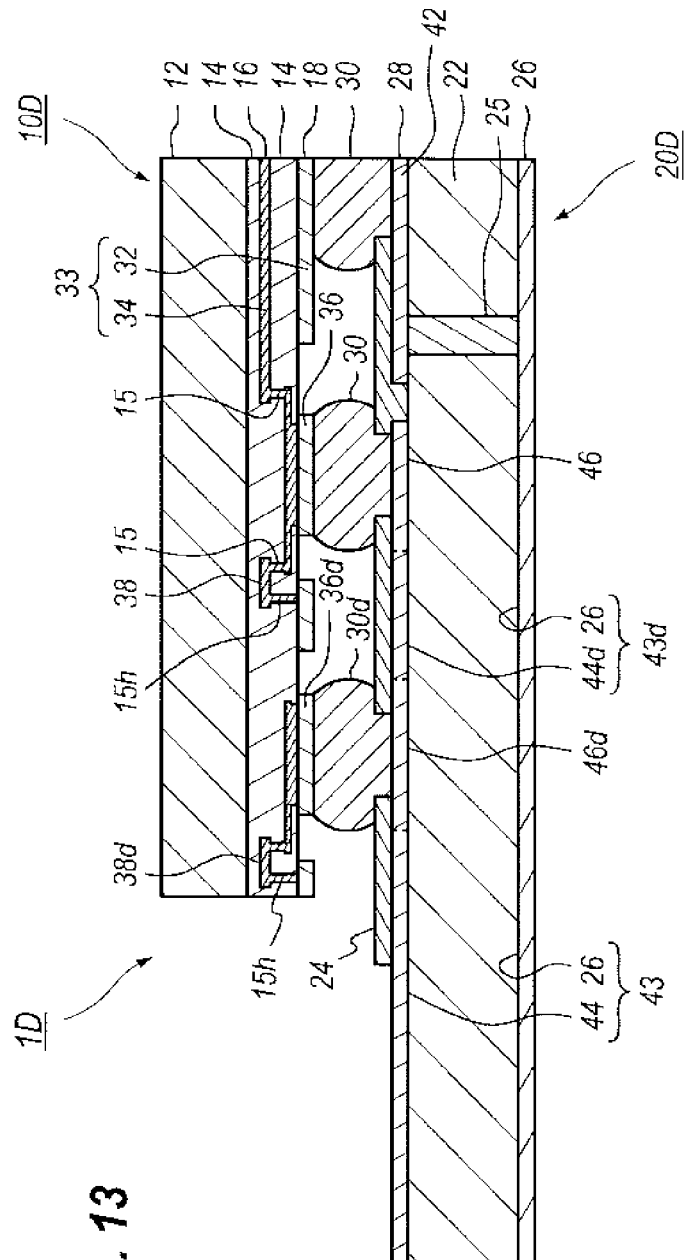
FIG. 13 schematically illustrates a cross section of an electronic apparatus of a fifth embodiment.
Figure 14A:
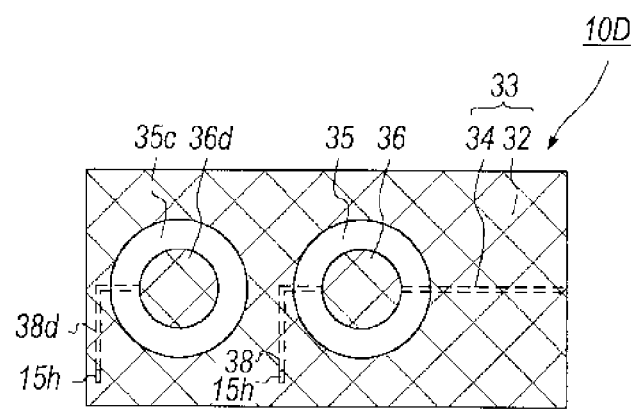
FIG. 14A is a plan view of a semiconductor device.

A fifth embodiment has an arrangement where the short stub includes a bump. FIG. 13 schematically illustrates a cross section of an electronic apparatus 1D of the fifth embodiment. FIG. 14A is a plan view of a semiconductor device 10D, and FIG. 14B is a plan view of an assembly base 20D, each according to the fifth embodiment.

The semiconductor device 10D of the present embodiment includes an additional pad 36d outside of the stub line 38 that is connected to the pad 36. The additional pad 36d, which is electrically isolated from the pad 36 in the semiconductor device 10D, accompanies an additional stub line 38d that is formed by the interconnection 16 and overlaps with the ground pattern 32. One end of the additional stub line 38d is connected to the pad 36d through the via hole 15h; while, the other end of the additional stub line 38d is grounded to the ground pattern 32 through the other via hole 15h.

Figure 14B:
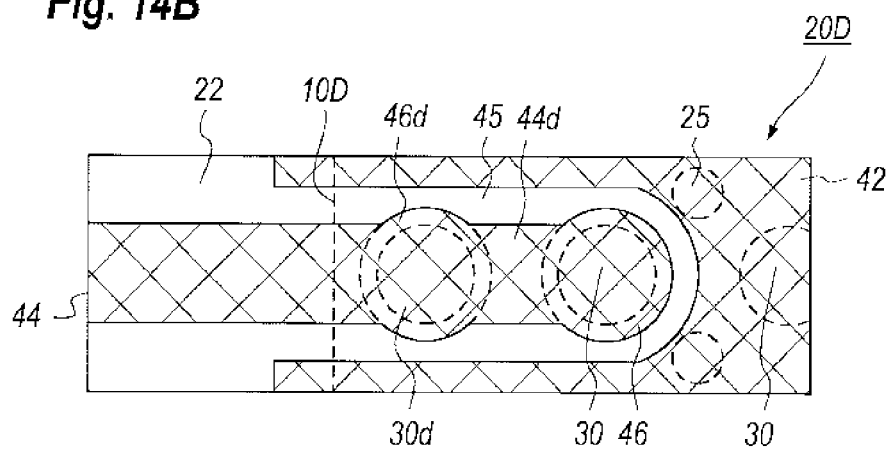
FIG. 14B is a plan view of an assembly base, each according to the fifth embodiment.

The assembly base 20D, as shown in FIG. 14B, also includes an additional pad 46d outside of the pad 46, where two pads 46 and 46d are connected by a signal line 44d that constitutes a transmission line 43d accompanied with the ground pattern 26 on the back surface of the substrate 22.

The additional pad 46d is connected to the signal line 44 and also connected to the pad 36d on the top surface of the semiconductor device 10D by a bump 30d.

Figure 15:
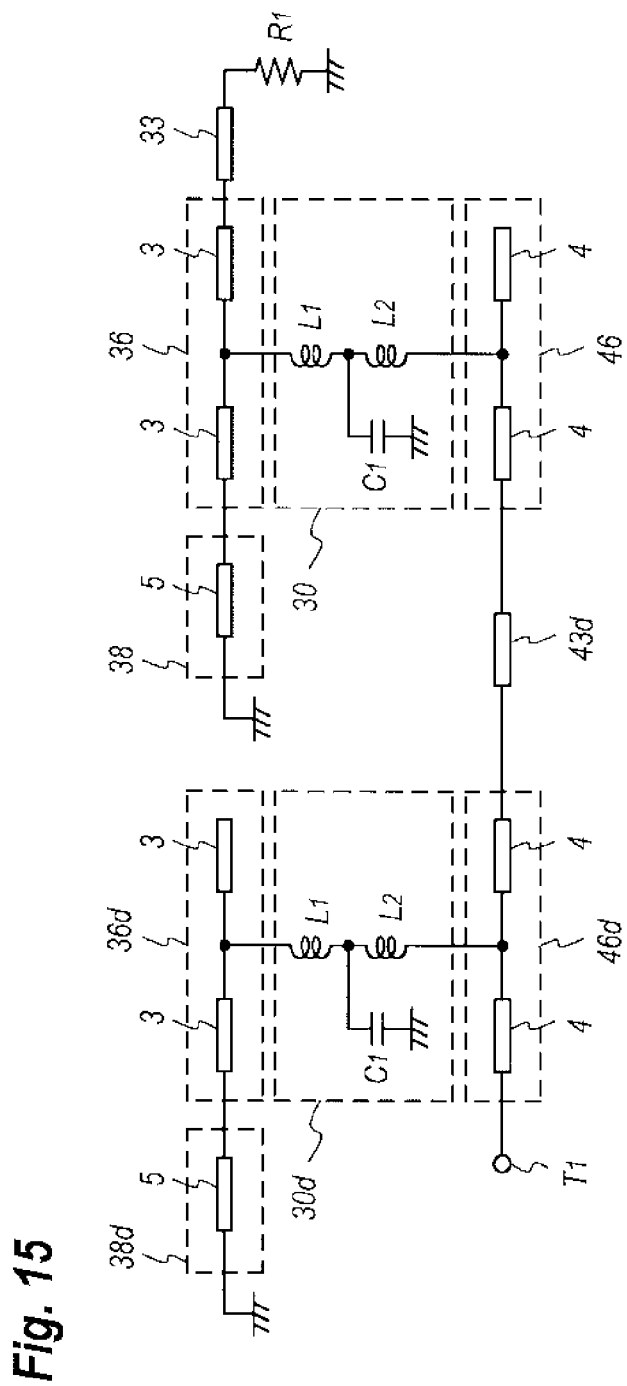
FIG. 15 shows an equivalent circuit diagram that reflects the arrangement of the electronic apparatus of the fifth embodiment shown in FIGS. 13 to 14B.

FIG. 15 shows an equivalent circuit diagram that reflects the arrangement of the electronic apparatus 1D shown in FIGS. 13 to 14B. As shown in the circuit diagram of FIG. 15, the pad 46 on the assembly base 20D is connected to the pad 46d through the signal line 44d. The pad 46d is coupled with the terminal $T_1$ and grounded through the bump 30d, the pad 36d, and the stub line 38d. Thus, the bump 30d, the pad 36d, and the stub line 38d may operate as a short stub for the pad 46d. When the width of the stub line 38d is set to be the same with the width of the aforementioned stub line 38, the stub line 38d preferably has a length shorter than the length of the previous stub line 38. For instance, when the previous stub line 38 has a width of 250 μm, the stub line 38d of the present embodiment preferably has a width of 200 μm, which makes the total electrical length of the short stub constituted by the bump 30d, the pad 36d, and the stub line 38d shorter than a quarter wavelength λ/4 of a signal undergoing the present high frequency apparatus 1D, which may compensate the capacitance attributed to the pad 46d.

Assuming a case where a semiconductor device includes an input terminal and an output terminal each assigned to the pads not arranged in outermost areas of the semiconductor device such as the pad 36 in FIG. 14A. Even in such a case, the semiconductor device needs to include the pads arranged in the outermost areas when the semiconductor device is mounted on the assembly base by the BGA technique. In such a case, the inner pad on the assembly base, which is connected to the inner pad of the semiconductor device, needs to be extracted through the outer pad, and the outer pads in both the semiconductor device and the assembly base inevitably form a parasitic capacitor, which degrades the high frequency performance. The present embodiment shown in FIGS. 13 to 14B provides the stub line 38d between the pad 36d and the ground pattern 32, which may effectively compensate the parasitic capacitance around the pads 36d and 46d, to suppress the signal reflection thereat.

The arrangement of the pads 36d and 46d with the stub line 38d may be applicable to an MMIC shown in FIG. 8. Also the stub line 38d may be grounded through a capacitor described in FIG. 10.

Sixth Embodiment

Figure 16A:
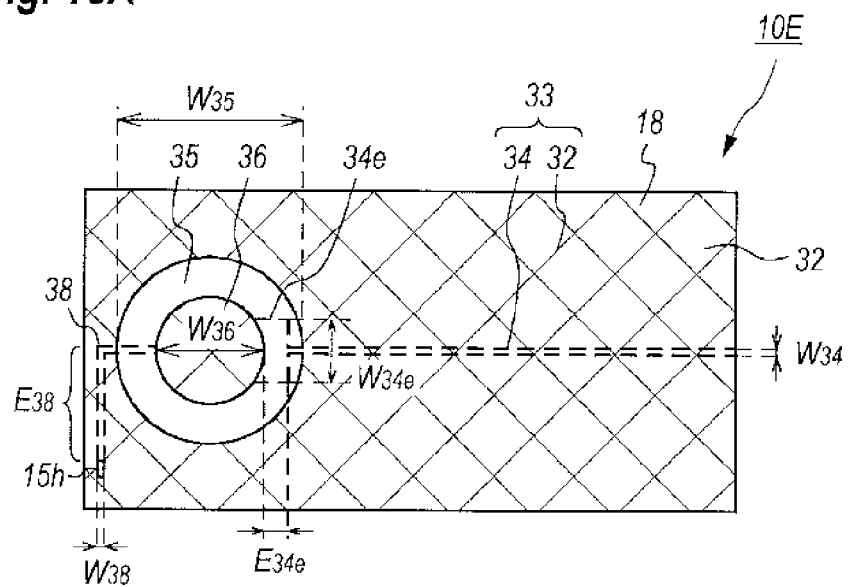
FIG. 16A schematically illustrates a plan view of a semiconductor device according to a sixth embodiment.

FIG. 16A schematically illustrates a plan view of a semiconductor device 10E according to a sixth embodiment. The semiconductor device 10E has a feature distinguishable from those of the aforementioned embodiments, which is that the signal line 34 includes a widened line 34e adjacent to the pad 36, where the widened line 34e has a length $E_{34e}$ and a width $W_{34e}$. A reason why the signal line 34 accompanies the widened line 34e is to compensate the signal reflection $S_{11}$ of the pad 36 at frequencies higher than 80 GHz.

That is, the stub line 38 of the present embodiment may compensate the high frequency performance from 40 to 60 GHz, as shown in FIGS. 7A and 7B. However, the performance in a region exceeding 80 GHz is left uncompensated compared to the performance of the comparable apparatus 100 even if the arrangements of the stub line 38 are varied in various ways. For instance, numerical calculations for the s-parameter $S_{11}$ were carried out as varying the length $E_{38}$ of the stub line 38 from 50 to 500 μm, where other conditions, namely, the dimensions and the materials of the respective elements were the same with those of the aforementioned embodiment.

Figure 17A:
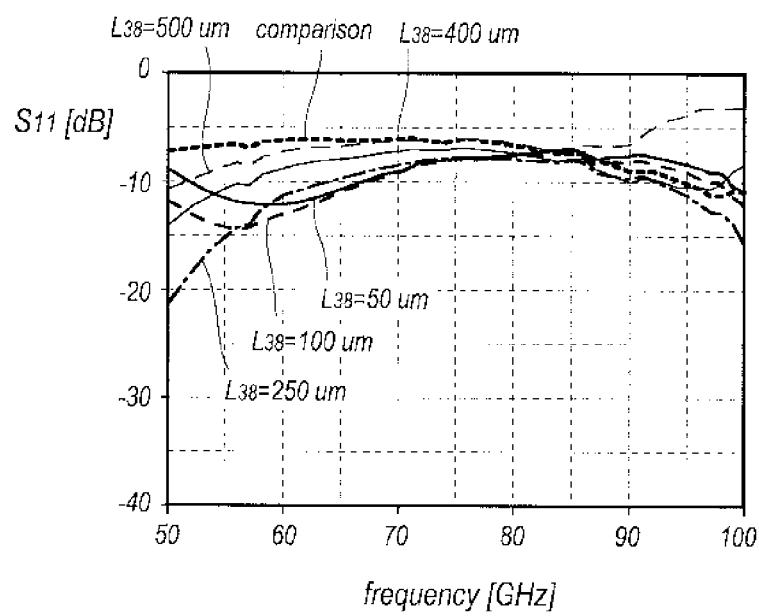
FIG. 17A shows frequency response of the s-parameter $S_{11}$ of the electronic apparatus of the sixth embodiment shown in FIG. 16A.
Figure 17B:
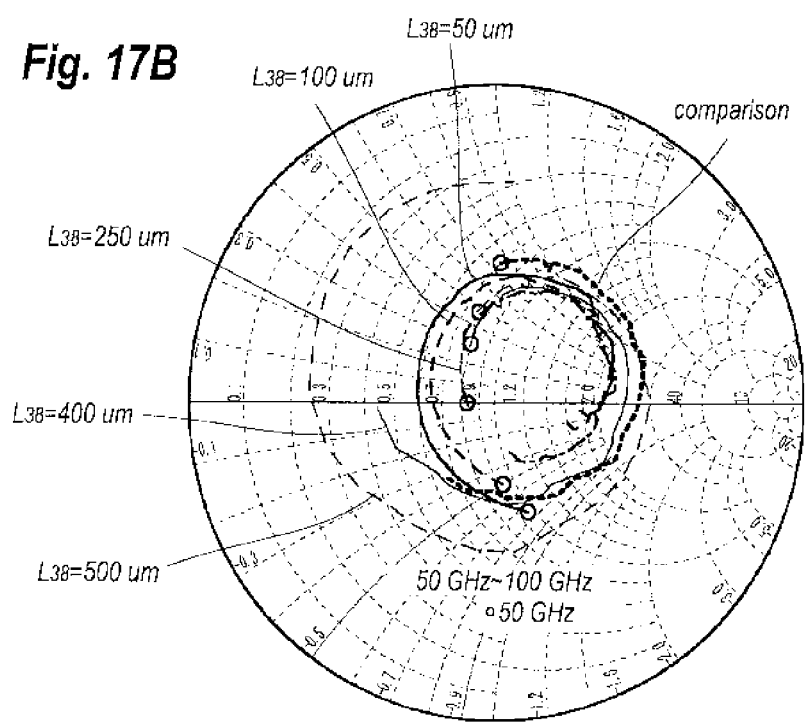
FIG. 17B shows a smith chart of the response of the s-parameter $S_{11}$.

FIG. 17A shows frequency response of the s-parameter $S_{11}$ from 50 to 100 GHz as varying the length $E_{38}$ of the stub line 38; while, FIG. 17B shows a smith chart of the response of the s-parameter $S_{11}$. As shown in FIG. 17A, the signal reflection $S_{11}$ becomes substantially independent of the length $E_{38}$ of the stub line 38 around 80 GHz. Specific responses of the s-parameter $S_{11}$ are as follows at 85 GHz.

TABLE 3

| Length $E_{38}$ (μm) | $S_{11}$ (dB) |
| --- | --- |
| Comparison (no stub line) | −7.4 |
| 50 | −6.9 |
| 100 | −7.3 |
| 250 | −7.9 |
| 400 | −7.9 |
| 500 | −7.0 |

That is, even when the stub line 38 has a length of 500 μm, improvement in the signal reflection, $S_{11}$, compared to that of the comparative example, is limited to only 0.4 dB.

Moreover, in frequencies higher than 90 GHz, the signal reflection $S_{11}$ considerably degraded except for the length $E_{38}$ of 250 μm. The length $E_{38}$ of 500 μm drastically degraded the signal reflection $S_{11}$. The widened line 34e of the present embodiment may improve the signal reflection $S_{11}$ in those high frequencies higher than 90 GHz.

Figure 16B:
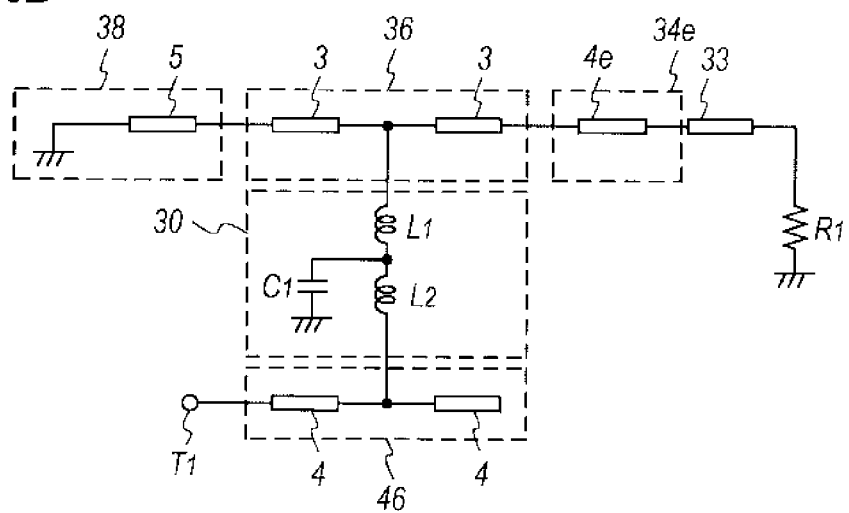
FIG. 16B is a circuit diagram of an electronic apparatus including a widened line of the sixth embodiment.

FIG. 16B is a circuit diagram assumed in the numerical calculation to investigate the function of the widened line 34e that may be equivalently regarded as a transmission line 4e that operates as a capacitor. That is, the widened line 34e operating as a capacitor is interposed between the transmission line 33 and the pad 36. Conditions of the widened line 34e and the stub line 38 are given in Table 4 below.

TABLE 4

| Widened line 34c | $W_{34c}$ = 100 μm, $E_{34c}$ = 30 μm |
| --- | --- |
| Stub line 38 | $Z_0$ = 50 Ω, $W_{38}$ = 10 μm, $E_{38}$ = 60 μm |

Other conditions for the numerical calculations were the same with those for the aforementioned embodiment.

Figure 18A:
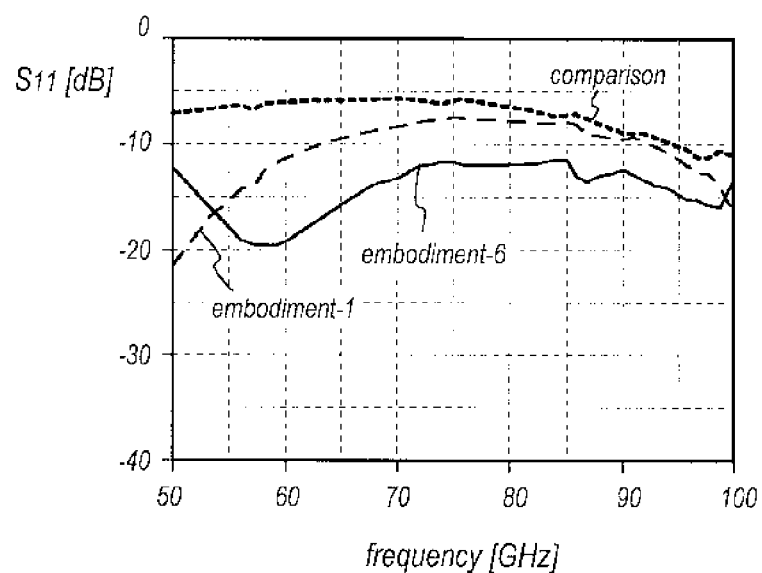
FIG. 18A compares the frequency responses from 50 to 100 GHz of the signal reflections $S_{11}$ of the electronic apparatuses according to the first embodiment and the sixth embodiment with that of the comparative example.
Figure 18B:
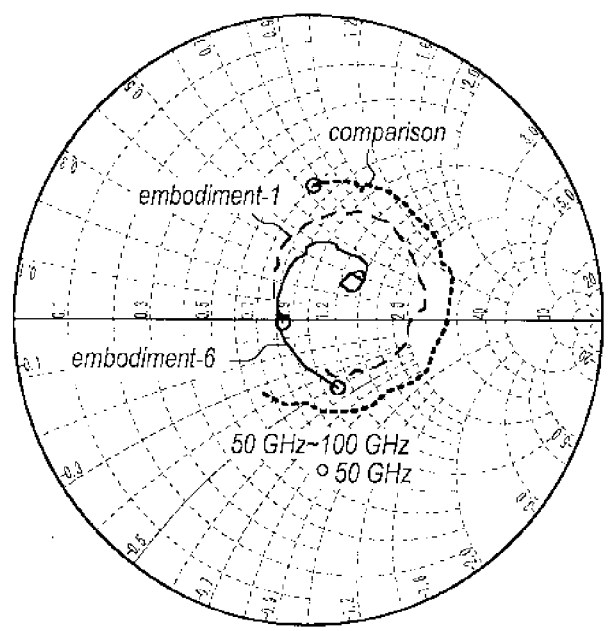
FIG. 18B shows the comparison thereof on a smith chart.

FIG. 18A compares the frequency responses from 50 to 100 GHz of the signal reflections $S_{11}$ of the first embodiment and the sixth embodiment with that of the comparative example; while, FIG. 18B shows the smith chart of the signal reflection $S_{11}$. As clearly shown in FIG. 18A, the signal reflection $S_{11}$ for the present embodiment becomes smaller than that of the comparative example in frequencies from 50 to 100 GHz. The signal reflection at 80 GHz is calculated as follows.

TABLE 5

| | $S_{11}$ (dB) |
| --- | --- |
| Comparison (no stub line) | −7.36 |
| First embodiment | −7.92 |
| Sixth embodiment | −11.59 |

Thus, the widened line 34e, combined with the stub line 38, may improve the signal reflection $S_{11}$ at least 4 dB at the frequency of 80 GHz.

As described, the stub line 38 may operate as a short stub that compensates the capacitance formed between the pad 36 and the ground pattern 32. While, the widened line 34e may be regarded as a capacitor from a view point of the lumped parameter circuit. Accordingly, the widened line 34e increases capacitance of a capacitive component that is once decreased by the short stub of the stub line 38.

However, considering the widened line 34*e* from the viewpoint of the distributed parameter circuit, the compensation by the widened line 34*e* may be reasonably understood. That is, when the pad 36 is supposedly divided into two parts, one of the two parts at a side of the stub line 38 is regarded as an open stub and operates as a capacitor with respect to the ground pattern 32. The stub line 38, which operates as the short stub, may compensate this imaginary capacitor. On the other hand, the other portion of the pad 36 at the side of the widened line 34*e* also operates as a capacitor to compensate the impedance mismatch between the transmission line 33 and the pad 36. Without the widened line 34*e*, the impedance mismatching between the transmission line 33 and the pad 36 is left, which degrades the signal reflection $S_{11}$ thereat at higher frequencies as shown in FIG. 17A. The widened line 34*e* may match the impedance, or compensate the impedance mismatching between the transmission line 33 and the pad 36, which may improve the signal reflection $S_{11}$ at the pad 36.

The widened line 34*e*, in the width $W_{34e}$ and the length $E_{34e}$, may be optionally selectable so as to improve the signal reflection $S_{11}$ most. The width $W_{34e}$ of the widened line 34*e* may be variable. Also, the stub line 38 may extend from the pad 36 toward an optional direction with respect to the direction of the signal line 34. The stub line 38 preferably makes an angle greater than 90° against the signal line 34.

Figure 19:
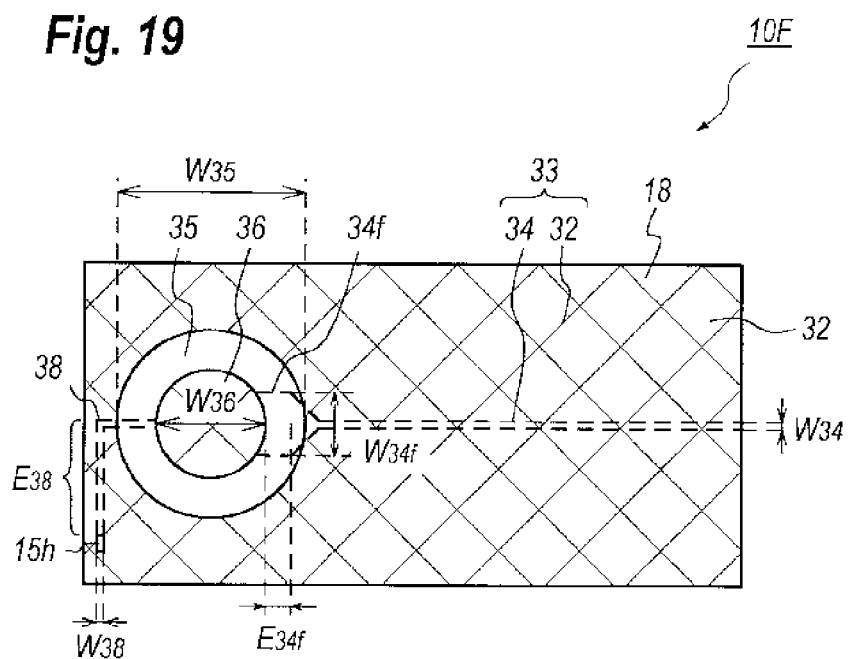
FIG. 19 schematically illustrates a plan view of a semiconductor device modified from the semiconductor device of the sixth embodiment shown in FIG. 16A.

FIG. 19 schematically illustrates a plan view of a semiconductor device 10F modified from the semiconductor device 10E of the sixth embodiment shown in FIG. 16A. The semiconductor device 10F has a feature that a widened line 34*f* thereof has tapered edges, namely, a width of the widened line $W_{38f}$ gradually decreases from the pad 36 to the transmission line 33. Such a widened line 34*f* may show functions same with those above described. Also, the semiconductor devices 10A to 10C in the aforementioned embodiments may be equipped with a widened line 34*d*.

Seventh Embodiment

Figure 20:
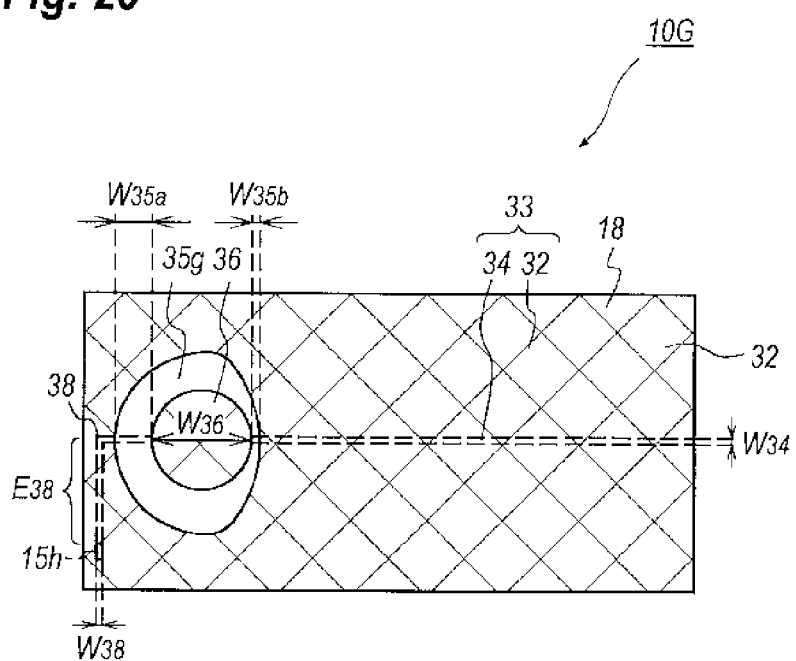
FIG. 20 schematically illustrates a plan view of a semiconductor device according to a seventh embodiment.
Figure 21A:
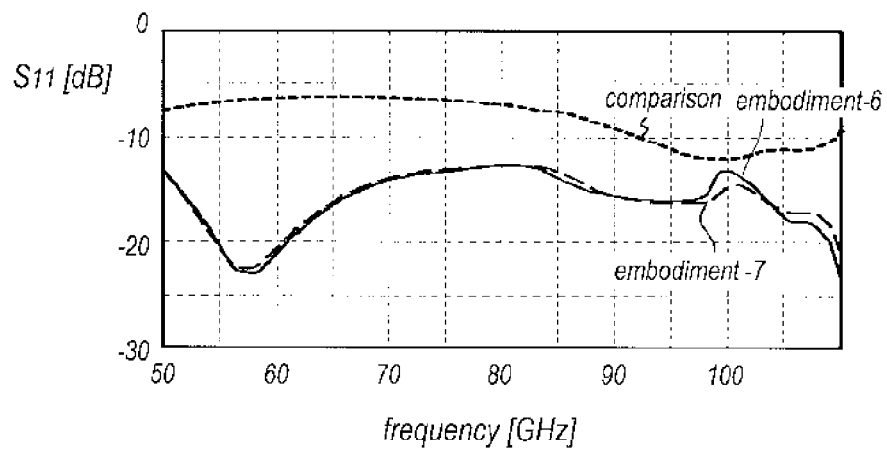
FIG. 21A compares the s-parameters $S_{11}$ of the semiconductor devices of the sixth embodiment and the seventh embodiment with that of the comparative example.
Figure 21B:
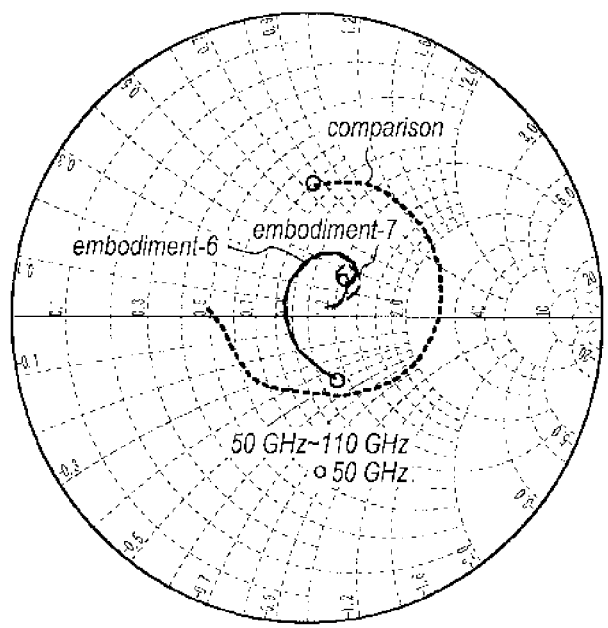
FIG. 21B shows the comparison thereof on a smith chart.
Figure 22A:
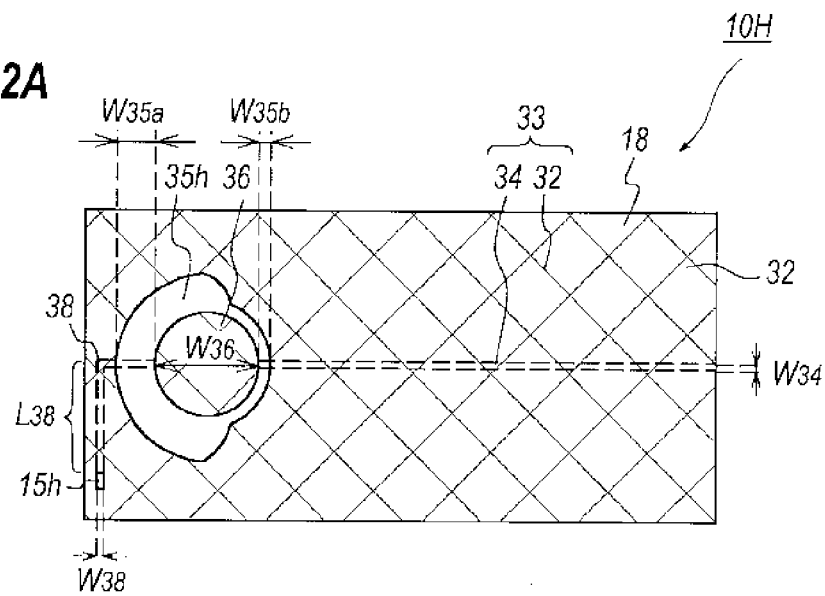
FIGS. 22A and 22B are plan views of semiconductor devices each modified from the semiconductor device of the seventh embodiment shown in FIG. 20.
Figure 22B:
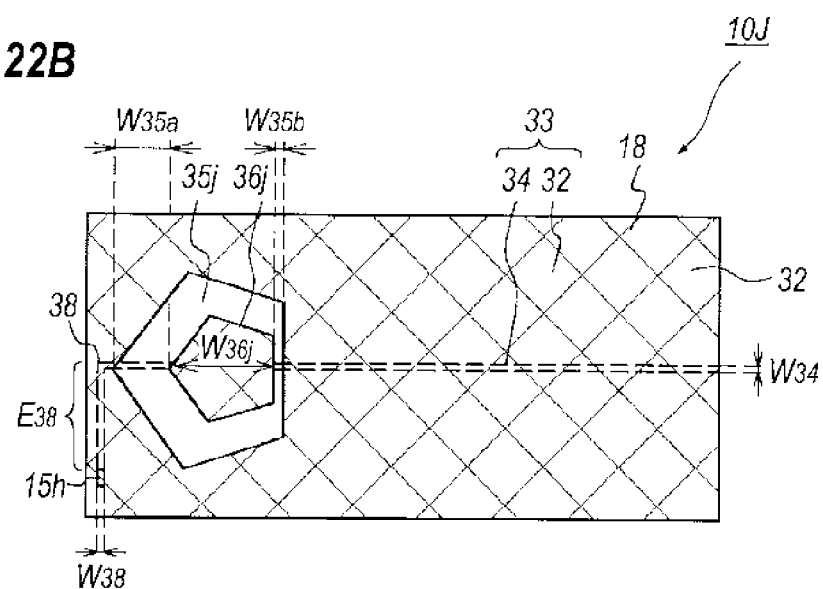
Figure 23A:
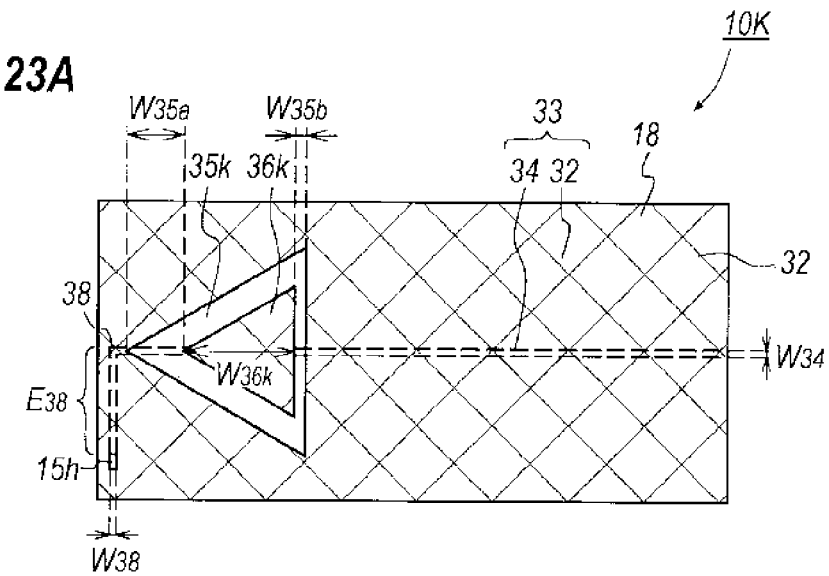
FIGS. 23A and 23B are plan view of semiconductor devices each modified from the semiconductor device of the seventh embodiment shown in FIG. 20.
Figure 23B:
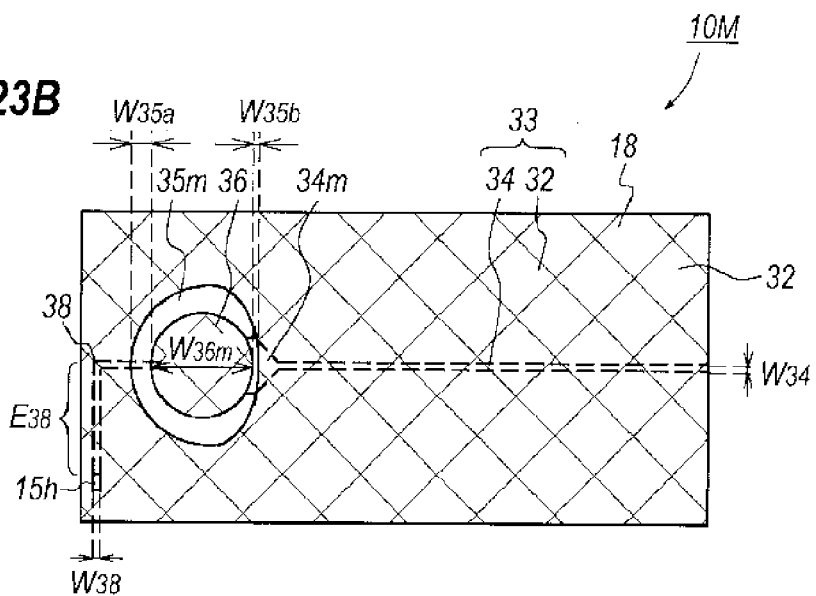

FIG. 20 schematically illustrates a plan view of a semiconductor device 10G that provides a feature distinguishable from those of the aforementioned embodiments in that the pad 36 is placed in a vacant spot 35*g* offset from a center thereof. Setting distances between respective edges of the pad 36 and the ground pattern 32 at the side from which the stub line 38 is extracted and at the side from which the transmission line 33 is extracted, $W_{35a}$ and $W_{35n}$, respectively, the former distance $W_{35a}$ is greater than the latter distance $W_{35b}$ in the semiconductor device 10G of the present embodiment. Assuming that the distances $W_{35a}$ and $W_{35b}$ are 50 μm and 10 μm, respectively, the signal reflection $S_{11}$ from 50 to 110 GHz was numerically calculated as those shown in FIGS. 21A and 21B. As shown in FIG. 21A, the signal reflection $S_{11}$ becomes comparable to that of the sixth embodiment shown in FIG. 16A in those frequencies.

In the seventh embodiment, the capacitance attributed to the pad 36 at the side of the signal line 34 becomes larger as the distance $W_{35v}$ becomes smaller, which is equivalent to the arrangement where the pad 36 accompanies the widened line 34*e* or 34*f* with the signal line 34. Thus, the signal reflection $S_{11}$ may be improved by narrowing the distance $W_{35b}$ of the vacant spot 35*g* at the side of the signal line 34. The distance $W_{35b}$ is optional and determined such that the signal reflection $S_{11}$ in frequencies greater than 80 GHz is compensated most.

FIGS. 22A to 23B show various arrangements of vacant spots 35*h* to 35*m* in semiconductor devices 10H to 10M. As shown in FIGS. 22A to 23A, the vacant spots 35*h* to 35*h* have widened areas, where the distance $W_{35b}$ is substantially constant, compared with the arrangement shown in FIG. 20. Thus, the area, where the vacant spots 35*h* to 35*k* have respective distances substantially constant between the pad 36 and the ground pattern 32 at the side of the signal line 34, may be optionally determined. Moreover, as shown in FIGS. 22B and 23A, pads 35*j* and 35*k* may have optional planar shapes, where the pad 35*j* in FIG. 22B has a pentagonal shape, while, that in FIG. 23A has a triangular shape. The semiconductor device 10M shown in FIG. 23B includes a widened line 34*m* in addition to the arrangement of the vacant spot 35*m* with variable distances. The widened line 34*m* may expand the distance $W_{35b}$ because a portion of the capacitance between the pad 36 and the ground pattern 32 at the side of the signal line 34 is compensated by the existence of the widened line 34*m*.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor device, comprising:
   a semiconductor substrate that includes a semiconductor active element;
   a ground pattern provided on the semiconductor substrate, an insulating layer being sandwiched between the semiconductor substrate and the ground pattern;
   a signal line provided in the insulating layer, the signal line being connected to the semiconductor active element and constituting a transmission line accompanied with the ground pattern by facing the ground pattern;
   a pad provided on the semiconductor substrate, the pad being connected to the signal line; and
   a stub line that overlaps with the ground pattern and is interposed in the insulating layer, the stub line being connected to the pad in one end thereof and to the ground pattern in another end thereof,
   wherein the stub line has a length shorter than a quarter wavelength (λ/4) of a signal carried on the transmission line.

2. The semiconductor device of claim 1, further comprising a capacitor, the stub line being connected to the ground pattern through the capacitor in an AC mode.

3. The semiconductor device of claim 1,
   further comprising another pad and another stub line,
   wherein the another stub line is connected between the another pad and the ground pattern and has a length shorter than the quarter wavelength (λ/4) of the signal.

4. The semiconductor device of claim 1,
   further comprising a widened line provided between the pad and the transmission line,
   wherein the widened line has a width wider than a width of the signal line.

5. The semiconductor device of claim 4,
   wherein the width of the widened line gradually increases from the signal line toward the pad.

6. The semiconductor device of claim 1,
   wherein the pad is provided in a vacant spot formed in the ground pattern, the pad being electrically isolated from the ground pattern by the vacant spot, and
   wherein the vacant spot has a first distance between the pad and the ground pattern at a side where the signal line is extracted from the pad and a second distance between the pad and the ground pattern at another side where the stub line is extracted from the pad, the first distance being smaller than the second distance.

7. The semiconductor device of claim 1,
wherein the stub line is extracted from the pad toward a direction making an angle of at least 90° with respect to a direction along which the signal line is extracted from the pad.

8. The semiconductor device of claim 1,
wherein the insulating layer includes a plurality of layers each having an interconnection, and
wherein the signal line and the stub line are provided in one, which is common to the signal line and the stub line, of the plurality of layers.

9. The semiconductor device of claim 8,
wherein the signal line and the stub line are connected to the pad through via holes each provided in a corresponding layer and connecting a corresponding interconnection.

10. The semiconductor device of claim 1,
wherein the stub line has a length longer than one twelfth of the wavelength ($\lambda/12$).

* * * * *